United States Patent [19]

Masuda

[11] Patent Number: 4,644,457
[45] Date of Patent: Feb. 17, 1987

[54] HIGH-FREQUENCY HIGH-VOLTAGE POWER SUPPLY

[75] Inventor: Senichi Masuda, Tokyo, Japan

[73] Assignee: NGK Sparkplug Co., Ltd., Japan

[21] Appl. No.: 739,169

[22] Filed: May 30, 1985

[30] Foreign Application Priority Data

Jun. 4, 1984 [JP] Japan ................................. 59-114350

[51] Int. Cl.$^4$ ............................................. H02M 5/45
[52] U.S. Cl. ........................................ 363/37; 363/58; 363/86
[58] Field of Search .................... 361/235; 363/35–37, 363/51, 58, 79, 86, 96, 135, 136

[56] References Cited

U.S. PATENT DOCUMENTS

| | | | |
|---|---|---|---|
| 3,569,819 | 3/1971 | Martzloff et al. ...................... | 363/58 |
| 3,723,849 | 3/1973 | Ludloff ................................. | 363/86 |
| 4,173,779 | 11/1979 | Abbondanti et al. ................. | 363/27 |
| 4,180,853 | 12/1979 | Scorso, Jr. et al. ................. | 363/79 X |
| 4,255,783 | 3/1981 | Messer ................................. | 363/96 |
| 4,286,317 | 8/1981 | Kommissari ........................ | 363/136 |
| 4,336,585 | 6/1982 | Moriarty et al. ..................... | 363/79 |
| 4,488,213 | 12/1984 | Buikema .............................. | 363/58 |

*Primary Examiner*—Patrick R. Salce
*Assistant Examiner*—Marc S. Hoff
*Attorney, Agent, or Firm*—Price, Heneveld, Cooper, DeWitt & Litton

[57] ABSTRACT

A high-frequency high-voltage power supply in which a high-frequency high-voltage is generated with the aid of L-C oscillation without a high-frequency primary power supply or a high-frequency high-voltage converter. The negative output terminal of a first D.C. high-voltage power supply and the positive output terminal of a second D.C. high-voltage power supply are connected together and to one of the high-frequency high-voltage output terminals. Tank capacitors are connected between the positive and negative output terminals of the power supplies, respectively. One end of a first combination of a first thyristor and a first rectifier connected in anti-parallel relationship is connected to the positive output terminal of the first power supply with the anode of the first thyristor connected to the positive output terminal. One end of a second combination of a second thyristor and a second rectifier connected in anti-parallel relationship is connected to the negative output terminal of the second power supply with the cathode of the second thyristor connected to the negative output terminal. The other ends of the first and second combinations are connected to each other and to the other high-frequency high-voltage output terminal through a resonant inductance. A control device feeds high-frequency current pulses alternately to the gates of the thyristors to turn on the corresponding thyristors alternately.

20 Claims, 10 Drawing Figures

HIGH-FREQUENCY HIGH-VOLTAGE POWER SUPPLY

BACKGROUND OF THE INVENTION

1. Field of the Invention

The present invention relates to a less expensive high-frequency high-voltage power supply for efficiently feeding a high-frequency high-voltage to a large-sized capacitive load such as an ozonizer, or an A.C. corona type ionizer, an electric dust collector.

2. Description of the Known Art

Heretofore, in order to feed a high-frequency high-voltage to a large-sized capacitive load, the method has been employed in which a high-frequency primary power supply having a low voltage and a high power is constructed by making use of transistors, thyristors, thyratrons, transmitter tubes, etc. The output of the primary power supply is fed to a primary side (low voltage side) of a high-frequency high-voltage transformer, and the output on the secondary side (high voltage side) of the transformer is fed to an object load. However, in this case, since an ineffective power [K bar] to be fed to a load is remarkably large as compared to a power consumption [KW] of the load, the capacity [KVA] to be possessed by the above-mentioned high-frequency primary power supply and high-frequency high voltage transformer becomes excessively large, and hence the cost of the power supply becomes remarkably expensive. In addition, there was a shortcoming that the loss of the power supply was also large, and so, the efficiency was lowered. As a method for dealing with this problem, the method has been employed, in which an inductance having a value of $L=1/\omega^2 C_L[H]$ (where $\omega=$angular frequency of the power supply) that is adapted to compensate for a capacitance $C_L[F]$ of the above-mentioned capacitive load, is connected in parallel to the load to make the equivalent power-factor of the load equal to unity. However even in this case, since not only the number of turns of the secondary winding of the high-frequency high-voltage transformer is large but also sufficient inter-layer insulation as well as sufficient insulation of the secondary winding from the primary winding are necessitated, a leakage inductance $l_W$ and an inter-winding electrostatic capacitance $C_W$ of the secondary side become large. These hardly calculatable factors $l_W$ and $C_W$ would greatly influence the compensating conditions for the load capacitance, and so, it becomes very difficult to determine the value of the compensating inductance. Moreover, the parallel high resistance component R representing the power consumption of the above-referred capacitive load $C_L$ generally has remarkable nonlinearity because it is an equivalent resistance of the ozonizer discharge, corona discharge or the like. Therefore, the load circuit becomes a nonlinear type, and hence, not only compensation for the capacitance $C_L$ in a strict mean becomes impossible, but also even if an inductance L, which can approximately compensate for the capacitance $C_L$ at a certain operating point with regard to the current, voltage and frequency, is inserted, the compensation for the capacitance $C_L$ would become ineffective in response to slight change of the operating point. In other words, it is the present status of the art that the compensation for the load capacitance by means of the parallel inductance is also difficult. Hence sufficient reduction of the required capacity [KVA] of the high-frequency primary power supply and the high-frequency high-voltage transformer cannot be achieved either. Thus solution for the problems of high cost and large loss is difficult.

SUMMARY OF THE INVENTION

It is one object of the present invention to provide a high-frequency high-voltage power supply of low cost that can overcome the above-mentioned shortcomings in the prior art and that can efficiently feed a high-frequency high-voltage to a large-sized capacitive load.

According to the present invention, the aforementioned object can be achieved by generating a high-frequency high-voltage on the high voltage side with the aid of L-C oscillation without employing the high-frequency primary power supply and the high-frequency high-voltage transformer which would cause a low efficiency and a high cost.

The high-frequency high-voltage power supply according to the present invention comprises two D.C. high-voltage power supplies A and B. The negative output terminal of one D.C. high-voltage power supply A and the positive output terminal of the other D.C. high-voltage power supply B are connected with each other and then connected to one of the high-frequency high-voltage output terminals. Tank capacitors having a sufficiently large electrostatic capacitance Co as compared to an electrostatic capacitance $C_L$ of a load are connected between the output terminals of the respective D.C. high-voltage power supplies. The high-frequency high-voltage power supply also comprises a first combination of a first thyristor and a first rectifier connected in an anti-parallel relationship to each other and having one end connected to a positive output terminal of one D.C. high-voltage power supply A and a second combination of a second thyristor and a second rectifier connected in an anti-parallel relationship to each other and having one end connected to a negative output terminal of the other D.C. high-voltage power supply B. The direction of conduction of said first thyristor is such that the anode of said first thyristor is connected to the positive output terminal of said one D.C. high voltage power supply A. The direction of conduction of said second thyristor is such that the cathode of said second thyristor is connected to the negative output terminal of the other D.C. high voltage power supply B. The other ends of said first combination of said first thyristor and said first rectifier connected in an anti-parallel relationship to each other and said second combination of said second thyristor and said second rectifier connected in an anti-parallel relationship to each other are connected with each other and then connected to the other high-frequency high-voltage output terminal by the intermediary of a resonant inductance. The high-frequency high-voltage power supply further comprises a control device for feeding current pulses having a predetermined frequency alternately to the gates of the respective thyristors to turn on these thyristors alternately; whereby when a capacitive load is connected between said high-frequency high-voltage output terminals, said respective thyristors are alternately turned on by feeding current pulses from said control device alternately to the gates of said respective thyristors at said predetermined frequency. Each time the respective thyristors are turned on said respective tank capacitors are alternately conductively connected to said capacitive load through said resonant inductance, so that each time after the capacitance of said capacitive load has been charged alternately up to a positive or negative high voltage with the aid of L-C oscillation said capacitance is discharged to the respective tank capacitors through the respective rectifiers and the resonant inductance with the aid of L-C oscillation. At the same time, the respective thyristors are turned off, and thus a high-frequency high voltage can be applied to said load.

DETAILED DESCRIPTION OF THE PREFERRED EMBODIMENTS

Figure 1:
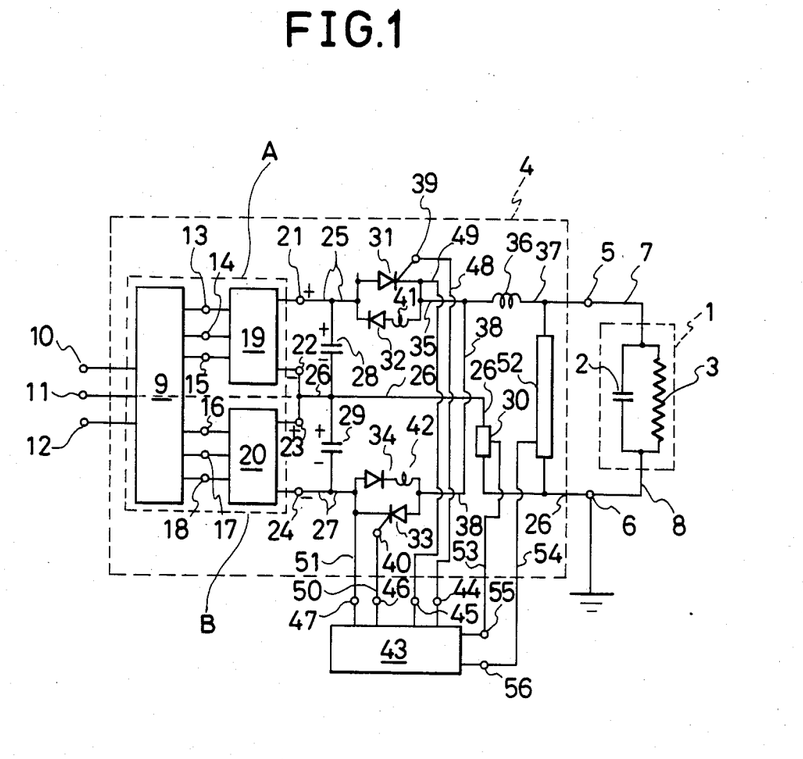
FIG. 1 is a circuit diagram showing the power supply of the present invention.

In FIG. 1, a region 1 encircled by a dotted line represents an equivalant circuit of a capacitive load which consists of a parallel connection of a capacitor 2 having an electrostatic capacitance $C_L[F]$ and a resistor 3 having a high resistance $R[\Omega]$. Another region 4 that is also encircled by a dotted line represents a high-frequency high-voltage power supply according to the present invention. Output terminals 5 and 6 of the power supply 4 are connected to the opposite ends of the above-described capacitive load 1 through lead wires 7 and 8, respectively. In this arrangement either one of the terminals 5 and 6 could be grounded, and in the illustrated example, the terminal 6 is grounded. Reference numeral 9 designates a high-voltage transformer of commercial frequency having two independent secondary windings for which any one of a single-phase transformer, a three-phase transformer and a multi-phase transformer is available, and in the illustrated example a three-phase transformer is employed. Primary terminals 10, 11 and 12 of the transformer are connected to a three-phase power supply of commercial frequency, and output terminals 13, 14 and 15, and 16, 17 and 18, respectively, of the two secondary windings are connected to input sides of three-phase rectifiers 19 and 20, respectively. Reference numerals 21 and 22, and 23 and 24, respectively designate output terminals of the three-phase rectifiers 19 and 20, respectively. With regard to the polarities of the output terminals, in the illustrated example, the terminals 21 and 23 are positive, while the terminals 22 and 24 are negative, and the terminals 22 and 23 are jointly connected. The output terminals 21 and 22 are connected via lead wires 25 and 26 to a tank capacitor 28 having a sufficiently large electrostatic capacitance Co as compared to the load capacitance $C_L$ (more than several times as large as the latter), while the output terminals 23 and 24 are connected via lead wires 26 and 27 to a tank capacitor 29 having a likewise sufficiently large electrostatic capacitance Co as compared to the load capacitance $C_L$, to charge these tank capacitors 28 and 29 with the illustrated polarities. In addition, the lead wire 26 is connected via a current detector 30 to the output terminal 6 of the high-frequency high-voltage power supply 4, and then it is grounded. Reference numerals 31 and 32 and reference numerals 33 and 34, respectively, designate pairs of a thyristor and a silicon rectifier connected in an antiparallel relationship with the illustrated directions of conduction. One ends of each of the thyristor 31 and the silicon rectifier 32 are connected via the lead wire 25 to a positive high-voltage end of the tank capacitor 28, while the other end of each of the thyristor 31 and the silicon rectifier 32 are connected via a lead wire 35, a resonant inductance 36 and a lead wire 37 to the output terminal 5 of the high-frequency high-voltage power supply 4. One end of each of the thyristor 33 and the silicon rectifier 34 are connected via the lead wire 27 to a negative high-voltage end of the tank capacitor 29, while the other end of each of the thyristor 33 and the silicon rectifier 34 are connected via a lead wire 38, the above-mentioned resonant inductance 36 and the lead wire 37 to the same output terminal 5. Reference numerals 39 and 40 designate gate terminals for turning on the thyristors 31 and 33, respectively, and reference numerals 41 and 42 designate small turn-off inductances inserted in series with the silicon rectifiers 32 and 34, respectively, for ensuring turn-off of the thyristors 31 and 33, respectively. Reference numeral 43 designates a thyristor control device for applying control signals to the thyristors 31 and 33, respectively, for making these thyristors alternately conduct at a predetermined frequency f. The control device feeds current pulses alternately from its output terminals 44 and 45 through lead wires 48 and 49 between the gate terminal 39 and the cathode of the thyristor 31 and from its output terminals 46 and 47 through lead wires 50 and 51 between the gate terminal 40 and the cathode of the thyristor 33. In addition, the control device 43 performs protective control such as prevention of short-circuiting of the outputs of the three-phase rectifiers 19 and 20 through the lead wire 38 caused by simultaneous firing of the thyristors 31 and 32 and interruption of the output upon an accident of short-circuiting of the load 1, as will be described later.

Now, the operation of the high-frequency high-voltage power supply 4 according to the present invention will be described.

Figure 2:
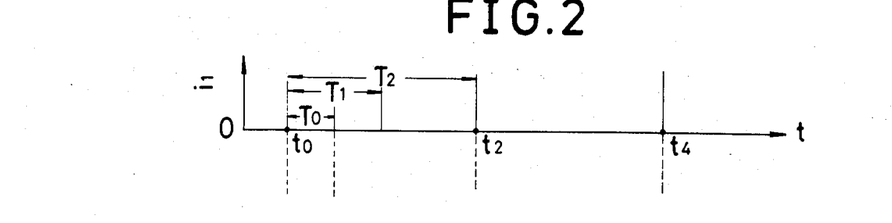
FIGS. 2 and 3 are waveform diagrams showing the current pulses fed from the control device to the gates of the thyristors.

At first, when a current pulse i1 as shown in FIG. 2 is fed from the output terminals 44 and 45 of the thyristor control device 43 through the lead wires 48 and 49 between the gate terminal 39 and the cathode of the thyristor 31 at a time point to, the thyristor 31 is immediately turned on; and so, a charged voltage $+V_o$ of the tank capacitor 28 is applied to the load 1 via the resonant inductance 36 and the output terminals 5 and 6. As a result, transient oscillation in the series circuit $C_O$-$L_O$-$C_L$ consisting of the tank capacitor 28 (capacitance $C_O[F]$), the resonant inductance 36 (the inductance value being assumed to be $L_O[H]$) and the load capacitor 2 (capacitance $C_L[F]$) is commenced, and hence charging for the capacitance $C_L$ is started. Now, as a result of the above-mentioned assumption of $C_O>>C_L$, the terminal voltage V(t) of the load 1 rises from zero and reaches a peak value Vp that is close to 2Vo at a time point to' as shown by a partial curve 57 in the voltage curve shown in FIG. 4. During this period, the load current I(t) flowing into the capacitor 2 takes the change of zero→maximum→zero as shown by a partial curve 58 in the current curve shown in FIG. 5. Subsequently, the circuit enters a discharging period of the load capacitance $C_L$ when the charge at the voltage Vp on the capacitor 2 begins to discharge towards the tank capacitor 28 through the resonant inductance 36, the turn-off inductance 41 and the silicon rectifier 32.

Owing to the voltage drop generated across the inductance 41 at that time, the thyristor 31, whose current has been already reduced to zero, is surely turned off. Then, the load current I(t) flows in the reverse direction as shown by a partial curve 59 in FIG. 5 and becomes zero at a time point t0″. As a result of this reverse flow, the electrostatic energy stored in the load capacitance $C_L$ is returned to the tank capacitor 28. During this period the load voltage V(t) is lowered as shown by a partial curve 60 in FIG. 4, and it reaches a residual voltage Vr at the time point t0″. At this moment, the transient oscillation ceases as blocked by the thyristor 31 which has been already turned off and the silicon rectifier 32. The period To of the transient oscillation during the above-mentioned process is given approximately by the following equation, provided that the resistance R of the resistor 3 is large and the relation of $C_o >> C_L$ is fulfilled:

$$To = 2\pi\sqrt{L_o C_L}$$

It is to be noted that the residual voltage Vr is generated by electric power consumption in the resistive component R of the load and the other circuit loss, and the larger the loss is, the larger becomes the residual voltage Vr.

Figure 3:
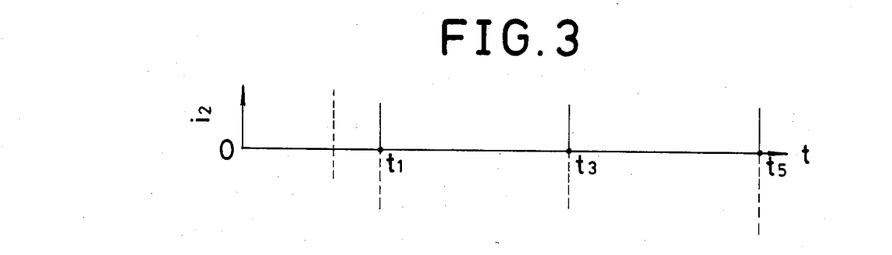
Figure 4:
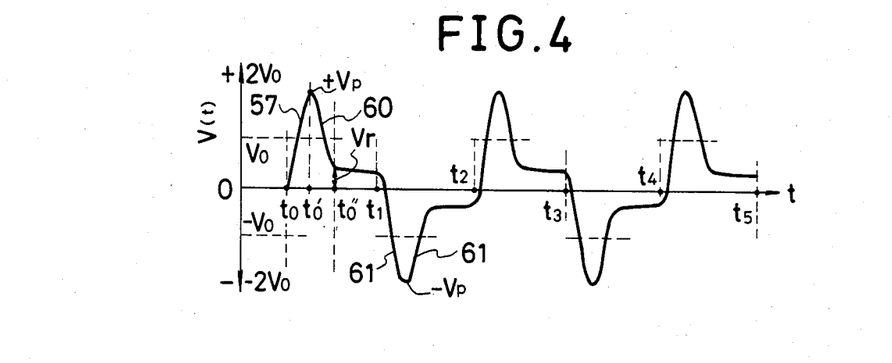
FIGS. 4 and 5 are waveform diagrams showing the waveforms of the output voltage and the output current, respectively.
Figure 5:
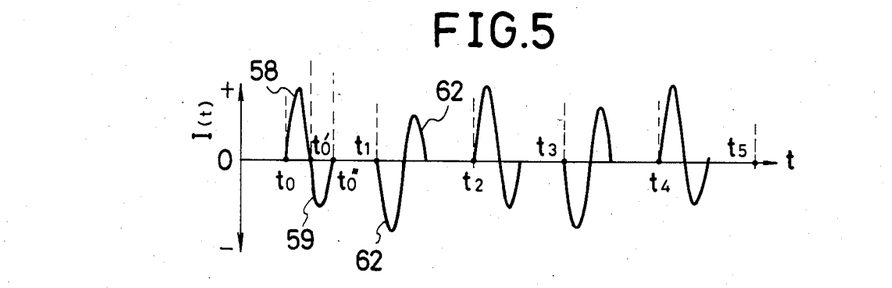
Figure 6:
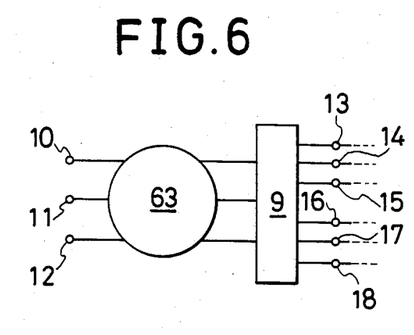
FIGS. 6, 7, 8, 9 and 10 are circuit diagrams, respectively, showing other preferred embodiments of the present invention.
Figure 7:
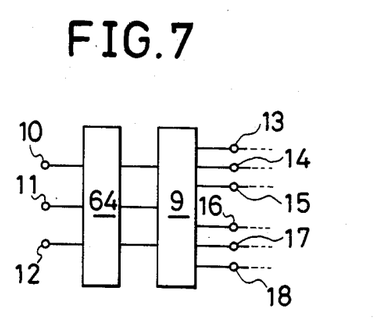
Figure 8:
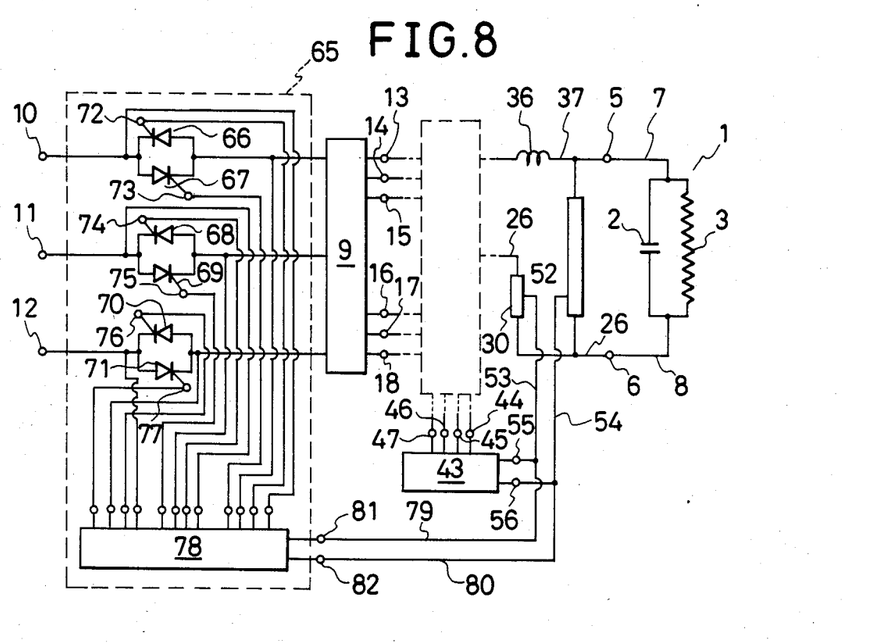

Subsequently, if a current pulse $i_2$ as shown in FIG. 3 is fed as a gate signal from the control device 43 through the terminals 46 and 47 and the lead wires 50 and 51 between the gate terminal 40 and the cathode of the thyristor 33 at a time point $t_1$, that is delayed by a period $T_1$ from the time point $t_0$, then the thysistor 33 is immediately turned on. Now the charged voltage $-V_0$ on the tank capacitor 29 is applied to the load 1 via the resonant inductance 36 and the output terminals 5 and 6. Hence transient oscillation in the series circuit $C_0$-$L_0$-$C_L$ consisting of the capacitance $C_0$[F] of the tank capacitor 29, the resonant inductance $L_0$[H] and the load capacitance $C_L$[F] is commenced. As a result, except for the fact that the algebraic sign of the load voltage V(t) and the load current I(t) is reversed, exactly the same process as that described above is traced, and the waveforms of the load voltage V(t) and the load current I(t) reveal themselves as represented by partial curves 61 and 62 in FIG. 4. Therefore, by feeding high-frequency current pulses $l_1$ and $l_2$ alternately from the terminals 44 and 45 and the terminals 46 and 47, respectively, of the control device 43 at a time interval $T_1$ as shown in FIGS. 2 and 3 to successively and alternately turn on and off the thyristors 31 and 33, a high-frequency high voltage V(t) having a cycle period of $T_2 = 2T_1$ that is equal to the time interval of $t_0 \rightarrow t_2$ as shown in FIG. 4, can be applied to the load; and in association therewith a high-frequency current likewise having a cycle period of $T_2$ can be fed to the load. In this instance, the peak value $V_P$ of the above-mentioned load voltage V(t) can be arbitrarily regulated by varying the primary voltage of the transformer 9 to thereby change the charged voltage $V_0$ of the tank capacitors 28 and 29 through the method of (1) switching taps of the primary winding or the secondary winding of the transformer 9, (2) inserting a three-phase induction regulator 63 between the transformer 9 and the terminals 10, 11 and 12 as shown in FIG. 6, (3) inserting a three-phase saturable reactor 64 between the transformer 9 and the terminals 10, 11 and 12 as shown in FIG. 7, or (4) inserting any appropriate voltage regulator such as a three-phase anti-parallel thyristor firing phase control type voltage regulator 65 or the like as shown in FIG. 8. In this figure, the voltage regulator 65 comprises anti-parallel connections of thyristors 66 and 67, 68 and 69, and 70 and 71, which are connected respectively to the three lead wires for connecting the primary terminals of the transformer 9 with the three-phase A.C. terminals 10, 11 and 12, respectively, and a primary control device 78 for feeding turn-on current pulses to the gates 72–77 of these thyristors 66–71 at appropriate phases of the three-phase A.C. voltage. The control device can arbitrarily control the input and output voltages of the transformer 9 and accordingly the output D.C. high voltage Vo of the three-phase rectifiers 19 and 20 not shown in FIG. 8 (shown in FIG. 1) by controlling the firing phases in both the positive and negative cycles of the respective phase voltages for turning on the respective thyristors.

Unless the turn-on of the thyristor 33 in FIG. 1 is effected after the thyristor 31 has been certainly turned off and the turn-on of the thyristor 31 is effected after the thyristor 33 has been certainly turned off—that is, if both of the thyristors 31 and 33 take a conducting state simultaneously—then the output of the transformer 9 would be short-circuited through the rectifiers 19 and 20 and the lead wire 38; and hence the transformer 9 and the rectifiers 19 and 20 would be burned out by the short-circuit current. In order to prevent this damage, provision is made such that the load current I(t) (FIG. 5) is detected by the current detector 30 interposed in the lead wire 26. The output signal of the detector 30 is applied to the control device 43 via a lead wire 53 and a terminal 55, and the gate signal current $i_1$ or $i_2$ cannot be fed unless a predetermined dead time $\Delta T$ has elapsed after the load current I(t) becomes I(t)=0. In addition, in the event that the load 1 has been short-circuited by any accident or in the event that a load current exceeding a tolerable value Io has flowed due to any cause, the transformer 9 and the rectifiers 19 and 20 would be burned out by the above-mentioned short-circuit current or excessive current. Therefore, in the control device 43 after a root-mean-square value Ie of the load current I(t) has been calculated, if it exceeds the tolerable value Io, it is determined that an excessive current has been generated and the control device 43 immediately stops feeding of the gate current $l_1$ or $l_2$. Upon short-circuiting, the output voltage V(t) becomes zero, which is detected by the output voltage detector 52. The detected result is determined in combination with the other detected result of Ie>Io, and thereby it is displayed that the accident is a short-circuit accident. On the other hand, when the accident is a mere excessive current accident, as a result of determination of V(t)≠0, it is displayed that the accident is an excessive current accident. Also, when the load 1 has been desconnected from the power supply 4 due to any accident such as disconnection or the like, since the signals of I(t)=0 and V(t)≠0 are fed from the current detector 30 and the output voltage detector 52 to the control device 43, likewise the gate signals $l_1$ and $l_2$ are interrupted and the generation of the disconnection accident is displayed. If the voltage regulator 65 making use of phase control for three-phase anti-parallel thyristors is used on the primary side of the transformer 9 as shown in FIG. 8, modification could be made such that the current detection signal from the current detector 30 and the voltage detection signal from the voltage detector 52 are fed to the primary side control device 78 via lead wires 79 and 80 and input terminals 81 and 82 to make this control device 78 achieve the above-described determination for accidents. Thus the power supply is interrupted on the primary side of the transformer 9 by stopping the feed of the current pulses from the control device 78 to the gates 72–77 of the thyristors 66–71. A serious accident can be prevented, and also the control device 78 is made to effect display of the accident.

Now it is to be noted that the output frequency f of the power supply according to the present invention is given by the following equation:

$$f = (1/T_2) = (1/2T_1) \tag{2}$$

This frequency f can be varied by varying the frequency of the current pulses fed from the control device 43 to the gates 39 and 40 of the thyristors 31 and 33 to thereby change the cycle period $T_1$. However, due to the restricting condition relating to the dead time $\Delta T$ as described above, the cycle period $T_1$ has the following lower limit:

$$T \geq T_o + \Delta T = 2\pi \sqrt{L \cdot C_L} + \Delta T \tag{3}$$

Accordingly, the highest (maximum) frequency f max is given by the following equation:

$$f_{max} = \frac{1}{2\pi \sqrt{L \cdot C_L} + \Delta T} \tag{4}$$

Therefore, in order to increase the maximum frequency f max it is necessary to reduce the inductance value L of the resonant inductance to a small value. However, in accordance with this reduction the peak value of the load current I(t) would increase. Hence there occurs the necessity of increasing current capacities of the thyristors 31 and 33 and the silicon rectifiers 32 and 34. The evaluation of economy associated with this increase and the tolerable value of (di/dt) of the thyristors 31 and 33 would determine the upper limit of the maximum frequency $f_{max}$.

Now, with regard to the waveform of the output voltage V(t), while it takes a distorted A.C. waveform having a plurality of pulse components as shown in FIG. 4 when $T_1 >> T_0$ is fulfilled, if the frequency f is raised until $T_1 \simeq T_0 + \Delta T$ is fulfilled, then it becomes close to a sinusoidal A.C. voltage waveform. In such a case, the means for applying positive and negative D.C. high voltages to the tank capacitors is not limited to the example shown in FIG. 1, but as a matter of course, any type of D.C. power supplies could be employed provided that they are two D.C. high-voltage power supplies or two variable-voltage D.C. high-voltage power supplies.

For instance, in place of the three-phase high-voltage transformer 9 having two secondary windings, two sets of combinations each consisting of one conventional three-phase high-voltage transformer having a single secondary winding and one three-phase rectifier could be used. Further a single-phase high-voltage transformer having two secondary windings each connected to one single-phase rectifier could be used. Alternatively, two sets of combinations each consisting of a conventional single-phase high-voltage transformer having one secondary winding and a single-phase rectifier could be employed. In addition, for the above-mentioned single-phase rectifier, any type of rectifier such as a single-phase half-wave rectifier, a single-phase full-wave transformer, or a bridge-connection single-phase full-wave rectifier could be used. Moreover, in order to constitute a variable-voltage D.C. high-voltage power supply, one may use switching of taps on the primary side or the secondary side of the high-voltage transformer 9; or else on the primary side of a single-phase or three-phase high-voltage transformer, one may use a single-phase or three-phase induction regulator, an autotransformer, a saturable reactor type voltage regulator in which a primary current of the high-voltage transformer is varied by means of a saturable reactor, an anti-parallel connection thyristor phase-control type voltage regulator in which thyristors connected in an anti-parallel relationship are inserted and the primary current of the high-voltage transformer is varied by controlling the turn-on phases of the thyristors, or the like.

Figure 9:
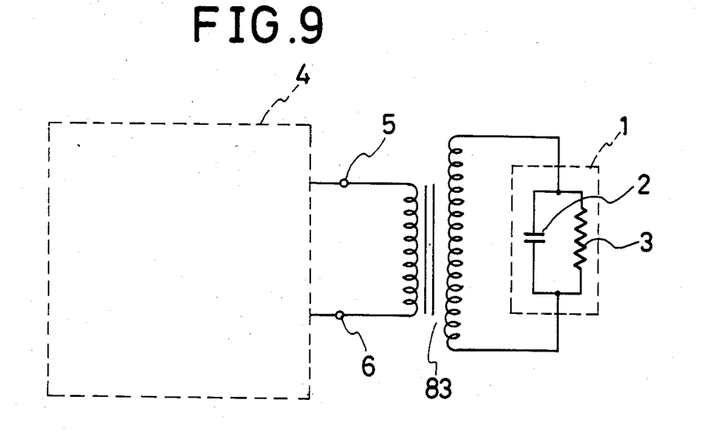

FIG. 9 shows another preferred embodiment of the present invention adapted for the case where the load 1 has a relatively small capacitance (since the construction of the high-frequency high-voltage power supply 4 is similar to that shown in FIG. 1, further illustration thereof has been omitted. At present, thyristors having ratings of a high voltage and a small current are difficult to obtain, and so, this embodiment aims at raising the electric power efficiency by making use of thyristors having a relatively small output power and obtaining a necessary high voltage with the aid of a step-up transformer connected between the output of the thyristors and the load 1. More particularly, output terminals 5 and 6 of the high-frequency high-voltage power supply 4 are connected to the load 1 by the intermediary of a step-up transformer 83.

Figure 10:
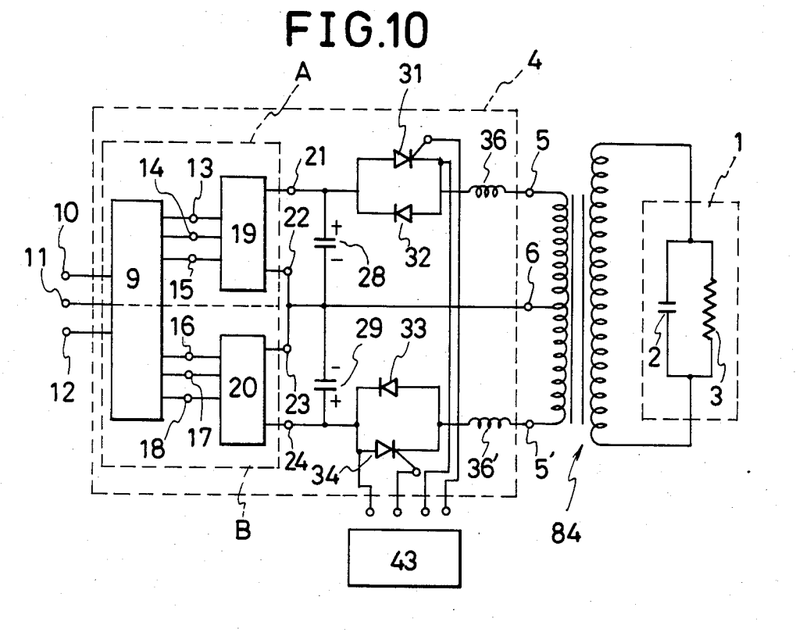

FIG. 10 shows still another preferred embodiment of the present invention adapted for the case where the load 1 has a relatively small capacitance. This embodiment aims at precluding the disadvantage that, in the embodiments shown in FIG. 1 or 9, if one of the thyristors should fail to be turned off and the both thyristors simultaneously take a conducting state, then the output of the high-voltage transformer 9 would be short-circuited through the three-phase rectifiers 19 and 20 and the lead wire 38; and hence the above-referred respective circuit components would be burned out or instability of the circuit operation would arise.

To that end, while the connection between the three-phase rectifier 19 and the tank capacitor 28 is identical to that shown in FIG. 1, (1) the polarity of the connection between the three-phase rectifier 20 and the tank capacitor 29 is reversed; (2) resonant inductances 36 and 36' are provided in the respective thyristor circuits; (3) output terminals 5 and 5' of high-frequency high voltages and another output terminal 6 to which negative output terminals 22 and 23 of the D.C. high-voltage power supplies A and B are connected in common are connected, respectively, to the opposite ends and a center tap of a primary winding of a step-up transformer 84; and (4) the load 1 is connected to a secondary winding of the step-up transformer 84.

The novel high-frequency high-voltage power supply according to the present invention is generally available for any load so long as the load is a capacitive load. By way of example, the power supply can be used for a high-frequency corona type ionizer, in which a corona discharge electrode and a non-corona opposite electrode, or corona discharge electrodes themselves, are opposed to each other and insulated from each other. A high-frequency high voltage is applied between these electrodes to generate a high-frequency A.C. corona discharge, resulting in production of plasma consisting of ions of both positive and negative polarities to be used for removing electric charge from a body or charging a body by extracting positive or negative monopolar ions from that plasma with the aid of an applied D.C. external electric field. Also, the high-frequency high voltage power supply according to the present invention can be used for (1) discharge-chemical apparatuses, in which production of ozone, oxidation of NO or $SO_2$, and other various discharge-chemical reactions are induced by passing a raw material gas through a discharge zone of high-frequency corona discharge that is generated by means of the above-described electrode construction, (2) high-frequency silent discharge that is generated by applying a high-frequency high voltage between opposed electrodes which are insulated from each other via a dielectric and a relatively small gap of gas space, (3) high-frequency creeping discharge that is generated by applying a high-frequency high voltage between a corona discharge electrode disposed on a front surface of a dielectric such as glass or high-purity alumina and a broad two-dimensional induction electrode disposed on the back surface of the same dielectric or within the same dielectric, or the like. Furthermore, the above-described high-frequency corona type ionizer is in itself available as an independent charge removing apparatus or a charging apparatus. A plurality of such ionizers in combination can be used as the so-called high-frequency excitation type boxer charger, in which a charging alternating voltage of sinusoidal or rectangular waveform at a relatively low frequency (50-500 Hz) is applied between two adjacent ionizers among the plurality of ionizers in combination. A high-frequency high voltage is applied between the opposed electrodes of one of the adjacent ionizers only when the one ionizer takes a predetermined positive or negative polarity with respect to the other of the adjacent ionizers to generate plasma (the high-frequency high voltage being not applied to the other ionizer). The above-described application of the high-frequency high voltage is alternately repeated for the adjacent ionizers in every half period of the aforementioned charging alternating voltage. Therefore ions of the above-referred predetermined polarity are extracted alternately from the respective ones of the adjacent ionizers and are made to run back and forth through the charging space between the adjacent ionizers. The ions are made to collide against dust particles between the respective ionizers alternately from the opposite directions and thus charge the dust particles in a single polarity. Also, the above-described high-frequency corona type ionizer and boxer charger can be used as a dust precharging device or a corona electrode assembly in a dust collecting section of an electric dust collecting apparatus of a filtering dust collecting apparatus.

Besides, as a matter of course, the high-frequency power supply according to the present invention can be applied arbitrarily to every application other than the above-described ones, which requires the application of a high-frequency high voltage to a capacitive load.

What is claimed is:

1. A high-frequency high-voltage power supply comprising:
   a pair of high-frequency high-voltage output terminals;
   first and second D.C. high-voltage power supplies each having positive and negative output terminals, the negative output terminal of said first D.C. high-voltage power supply and the positive output terminal of said second D.C. high-voltage power supply being connected to each other and to one of said high-frequency high-voltage output terminals;
   first and second tank capacitors each having a sufficiently large electrostatic capacitance $C_0$ as compared to an electrostatic capacitance $C_L$ of a load connected between the positive and negative output terminals of said first and second D.C. high-voltage power supplies;
   a first combination of a first thyristor and a first rectifier connected in anti-parallel relationship, a first end of said first combination being connected to the positive output terminal of said first D.C. high-voltage power supply with the anode of said first thyristor connected to the positive output terminal;
   a second combination of a second thyristor and a second rectifier connected in anti-parallel relationship, a first end of said second combination being connected to the negative output terminal of said second D.C. high-voltage power supply with the cathode of said second thyristor connected to the negative output terminal, the second end of each of said first combination and said second combination being connected to each other and to the other of said high-frequency high-voltage output terminals through a resonant inductance; and
   a control device for feeding high-frequency current pulses alternately to the gates of said first and second thyristors to turn on said first and second thyristors alternately, whereby when a capacitive load is connected between said high-frequency high-voltage output terminals, each time said first and second thyristors are turned on, said respective tank capacitors are alternately conductively connected to the capacitive load through said resonant inductance, and each time after the capacitance of the capacitive load has been charged alternately up to a positive or negative high voltage with the aid of L-C oscillation, the charge on the load is discharged alternately to said tank capacitors through said rectifiers and said resonant inductance again with the aid of L-C oscillation, said thyristors being turned off simultaneously with commencement of this discharge, and thus a high-frequency high voltage is applied to the load.

2. A high-frequency high-voltage power supply as claimed in claim 1, characterized in that said first and second D.C. high-voltage power supplies are variable-voltage D.C. high-voltage power supplies whose D.C. output voltages are variable.

3. A high-frequency high-voltage power supply as claimed in claim 1, characterized in that said first and second D.C. high-voltage power supplies are formed of a combination of a three-phase high-voltage transformer provided with two sets of three-phase secondary windings and two three-phase rectifiers connected to the output terminals of said respective three-phase secondary windings.

4. A high-frequency high-voltage power supply as claimed in claim 1, characterized in that said first and second D.C. high-voltage power supplies are formed of two three-phase high-voltage transformers and two three-phase rectifiers connected to the secondary terminals of said respective three-phase high-voltage transformers.

5. A high-frequency high-voltage power supply as claimed in claim 1, characterized in that said first and second D.C. high-voltage power supplies are formed of a single-phase high-voltage transformer provided with two secondary windings and two single-phase rectifiers connected to the secondary windings of said respective single-phase high-voltage transformers.

6. A high-frequency high-voltage power supply as claimed in claim 1, characterized in that said first and second D.C. high-voltage power supplies are formed of one single-phase high-voltage transformer provided with a center-tapped secondary winding and two single-phase rectifiers connected respectively between one terminal and said center tap of said secondary winding and between said center tap and the other terminal of said secondary winding.

7. A high-frequency high-voltage power supply as claimed in claim 1, characterized in that said first and second D.C. high-voltage power supplies are formed of two single-phase high-voltage transformers and two single-phase rectifiers connected to the secondary windings of said respective single-phase high-voltage transformers.

8. A high-frequency high-voltage power supply as claimed in claim 2, characterized in that said first and second variable-voltage D.C. high-voltage power supplies are formed of a high-voltage transformer, a voltage regulator connected to the primary of said high-voltage transformer, and a rectifier connected to the secondary of said high-voltage transformer.

9. A high-frequency high-voltage power supply comprising a pair of high-frequency high-voltage output terminals; two D.C. high-voltage power supplies A and B, a negative output terminal of one D.C. high-voltage power supply A and a positive output terminal of the other D.C. high-voltage power supply B being connected with each other and to one of said high-frequency high-voltage output terminals; a pair of tank capacitors each having a sufficiently large electrostatic capacitance $C_0$ as compared to an electrostatic capacitance C of a load connected between the positive and negative output terminals of said D.C. high-voltage power supplies A and B; one end of a first combination of a first thyristor and a first rectifier connected in anti-parallel relationship to each other connected to a positive output terminal of said D.C. high-voltage power supply A with the anode of said first thyristor connected to said positive output terminal; one end of a second combination of a second thyristor and a second rectifier connected in anti-parallel relationship to each other connected to a negative output terminal of said other D.C. high-voltage power supply B with the cathode of said second thyristor connected to said negative output terminal; the other ends of said first combination of said first thyristor and said first rectifier and said second combination of said second thyristor and said second rectifier connected to each other and to the other high-frequency high-voltage output terminal through a resonant inductance; and a control device for feeding high-frequency current pulses alternately to the gates of the respective thyristors to turn on the respective thyristors alternately, whereby when a capacitive load is connected between said high-frequency high-voltage output terminals, said respective thyristors are alternately turned on by feeding said current pulses from said control device alternately to the gates of said respective thyristors, each time the respective thyristors are turned on, said respective tank capacitors are alternately conductively connected to said capacitive load through said resonant inductance, then each time after the capacitance of said capacitive load has been charged alternately up to a positive or negative high voltage with the aid of L-C oscillation, the charge on said capacitance is discharged alternately to the respective tank capacitors through the respective rectifiers and the resonant inductance again with the aid of L-C oscillation, the respective thyristors are turned off simultaneously with commencement of this discharge, and thus a high-frequency high-voltage can be applied to said load, the frequency of the turn-on current pulses fed from the control device to the gates of said respective thyristors being variable, and hence the output frequency being variable.

10. A high-frequency high-voltage power supply as claimed in claim 8, characterized in that said voltage regulator is an induction regulator.

11. A high-frequency high-voltage power supply as claimed in claim 8, characterized in that said voltage regulator is an autotransformer.

12. A high-frequency high-voltage power supply as claimed in claim 8, characterized in that said voltage regulator is formed of:
a pair of thyristors connected in an anti-parallel relationship and connected in series with the primary winding of said high-voltage transformer; and
a primary control device for feeding turn-on current pulses to the gates of said respective thyristors at a predetermined phase of an A.C. primary voltage.

13. A high-frequency high-voltage power supply comprising a pair of high-frequency high-voltage output terminals; two D.C. high-voltage power supplies A and B, a negative output terminal of one D.C. high-voltage power supply A and a positive output terminal of the other D.C. high-voltage power supply B being connected with each other and to one of said high-frequency high-voltage output terminals; a pair of tank capacitors each having a sufficiently large electrostatic capacitance $C_O$ as compared to an electrostatic capacitance $C_L$ of a load connected between the positive and negative output terminals of said D.C. high-voltage power supplies A and B; one end of a first combination of a first thyristor and a first rectifier connected in anti-parallel relationship to each other connected to a positive output terminal of said D.C. high-voltage power supply A with the anode of said first thyristor connected to said positive output terminal; one end of a second combination of a second thyristor and a second rectifier connected in anti-parallel relationship to each other connected to a negative output terminal of said other D.C. high-voltage power supply B with the cathode of said second thyristor connected to said negative output terminal; the other ends of said first combination of said first thyristor and said first rectifier and said second combination of said second thyristor and said second rectifier connected to each other and to the other high-frequency high-voltage output terminal through a resonant inductance; a control device for feeding high-frequency current pulses alternately to the gates of the respective thyristors to turn on the respective thyristors alternately, whereby when a capacitive load is connected between said high-frequency high-voltage output terminals, said respective thyristors are alternately turned on by feeding said current pulses from said control device alternately to the gates of said respective thyristors, each time the respective thyristors are turned on, said respective tank capacitors are alternately conductively connected to said capacitive load through said resonant inductance, then each time after the capacitance of said capacitive load has been charged alternately up to a positive or negative high voltage with the aid of L-C oscillation, the charge on said capacitance is discharged alternately to the respective tank capacitors through the respective rectifiers and the resonant inductance again with the aid of L-C oscillation, the respective thyristors are turned off simultaneously with commencement of this discharge, and thus a high-frequency high-voltage can be applied to said load; and an output current being detected by providing a current detector inserted in any one of the lead wires connected to said respective output terminals, the detected signal being applied to said control device so that the turn-on current pulses for the respective thyristors may not be fed unless a predetermined dead time elapses after said output current has become zero, whereby generation of a short-circuiting current caused by simultaneous firing of the respective thyristors can be prevented, and further in that if a root-mean-square value of said output current exceeds a predetermined limit value, then feeding of said current pulses is stopped to prevent generation of an excessive current or a short-circuiting current caused by an accident in the load.

14. A high-frequency high-voltage power supply comprising a pair of high-frequency high-voltage output terminals; two D.C. high-voltage power supplies A and B, a negative output terminal of one D.C. high-voltage power supply A and a positive output terminal of the other D.C. high-voltage power supply B being connected with each other and to one of said high-frequency high-voltage output terminals; a pair of tank capacitors each having a sufficiently large electrostatic capacitance $C_O$ as compared to an electrostatic capacitance $C_L$ of a load connected between the positive and negative output terminals of said D.C. high-voltage power supplies A and B; one end of a first combination of a first thyristor and a first rectifier connected in anti-parallel relationship to each other connected to a positive output terminal of said D.C. high-voltage power supply A wth the anode of said first thyristor connected to said positive output terminal; one end of a second combination of a second thyristor and a second rectifier connected in anti-parallel relationship to each other connected to a negative output terminal of said other D.C. high-voltage power supply B with the cathode of said second thyristor connected to said negative output terminal; the other ends of said first combination of said first thyristor and said first rectifier and said second combination of said second thyristor and said second rectifier connected to each other and to the other high-frequency high-voltage output terminal through a resonant inductance; a control device for feeding high-frequency current pulses alternately to the gates of the respective thyristors to turn on the respective thyristors alternately, whereby when a capacitive load is connected between said high-frequency high-voltage output terminals, said respective thyristors are alternately turned on by feeding said current pulses from said control device alternately to the gates of said respective thyristors, each time the respective thyristors are turned on, said respective tank capacitors are alternately conductively connected to said capacitive load through said resonant inductance, then each time after the capacitance of said capacitive load has been charged alternately up to a positive or negative high voltage with the aid of L-C oscillation, the charge on said capacitance is discharged alternately to the respective tank capacitors through the respective rectifiers and the resonant inductance again with the aid of L-C oscillation, the respective thyristors are turned off simultaneously with commencement of this discharge, and thus a high-frequency high-voltage can be applied to said load; and an output voltage being detected by providing a voltage detector connected between said respective output terminals, the detected signal being applied to said control device to determine disconnection or short-circuiting in the load, whereupon feeding of the turn-on current pulses fed from said control device to said respective thyristors is stopped, and thus serious accidents caused by said disconnection or short-circuiting can be prevented.

15. A high-frequency high-voltage power supply as claimed in claim 12, characterized in that generation of an excessive current or a short-circuit current is detected by applying the detected signal for said output current to said primary control device, thereby feeding of the turn-on current pulses to said thyristors connected in an anti-parallel relationship to each other which are inserted in the primary of said high-voltage transformer is stopped, and thus generation of an excessive current or a short-circuit current in said load can be prevented.

16. A high-frequency high-voltage power supply as claimed in claim 12, characterized in that upon disconnection or short-circuiting accident in said load, said accident is detected and determined by applying the detected signal for said output voltage to said primary control device, thereby feeding of the turn-on current pulses to said thyristors connected in an anti-parallel relationship to each other is stopped, and thus serious accident in said load can be prevented.

17. A high-frequency high-voltage power supply as claimed in claim 1, characterized in that said high-frequency high-voltage output terminals are connected to the capacitive load through a step-up transformer.

18. A high-frequency high-voltage power supply comprising first and second high-frequency high-voltage output terminals;

first and second D.C. high-voltage power supplies each having positive and negative output terminals;

first and second tank capacitors connected between the positive and negative output terminals of said first and second D.C. high-voltage power supplies, respectively;

a first combination of a first thyristor and a first rectifier connected in anti-parallel relationship, the thyristor anode side of said first combination connected to the positive output terminal of said first D.C. high-voltage power supply;

a second combination of a second thyristor and a second rectifier connected in anti-parallel relationship, the thyristor anode of said second combination connected to the positive output terminal of said second D.C. high-voltage power supply, the thyristor cathode side of each of said first and second combinations connected to said first and second high-frequency high-voltage output terminals, respectively, through first and second resonant inductances, respectively;

a medium potential point between said first and second high-frequency high-voltage output terminals connected to the negative output terminals of said first and second D.C. high-voltage power supplies; and a step-up transformer connected to said first and second high-frequency high-voltage output terminals, any load being connected to said step-up transformer.

19. A high-frequency high-voltage power supply as claimed in claim 13, characterized in that generation of an excessive current or a short-circuit current is detected by applying the detected signal for said output current to said primary control device, thereby feeding of the turn-on current pulses to said thyristors connected in an anti-parallel relationship to each other which are inserted in the primary of said high-voltage transformer is stopped, and thus generation of an excessive current or a short-circuit in said load can be prevented.

20. A high-frequency high-voltage power supply as claimed in claim 14, characterized in that upon disconnection or short-circuiting accident in said load, said accident is detected and determined by applying the detected signal for said output voltage to said primary control device, thereby feeding of the turn-on current pulses to said thyristors connected in an anti-parallel relationship to each other is stopped, and thus serious accident in said load can be prevented.

* * * * *

UNITED STATES PATENT AND TRADEMARK OFFICE
CERTIFICATE OF CORRECTION

PATENT NO. : 4,644,457

DATED : February 17, 1987

INVENTOR(S) : Senichi Masuda

It is certified that error appears in the above-identified patent and that said Letters Patent is hereby corrected as shown below:

Column 2, line 19:

After "invention" insert --is characterized in that it--

Column 4, line 3:

"ends" should be --end--

Column 4, line 46:

"to," should be --$\underline{t}o$,--

Column 4, line 59:

"to'" should be --$\underline{t}o$'--

Column 5, line 6:

"t0"" should be --$\underline{t}0$"--

Column 5, line 11:

"t0"" should be --$\underline{t}0$"--

Column 5, line 26:

"i$_2$" should be --$\underline{i}_2$--

Column 5, line 31:

"t$_1$" should be --$\underline{t}_1$--

Column 5, line 31:

"t$_0$," should be --$\underline{t}_0$,--

Column 5, line 45:

"l$_1$ and l$_2$" should be --$\underline{l}_1$ and $\underline{l}_2$--

Column 5, line 51:

"t$_0$ → t$_2$" should be --$\underline{t}_0$ → $\underline{t}_2$--

UNITED STATES PATENT AND TRADEMARK OFFICE
CERTIFICATE OF CORRECTION

PATENT NO. : 4,644,457

DATED : February 17, 1987

INVENTOR(S) : Senichi Masuda

It is certified that error appears in the above-identified patent and that said Letters Patent is hereby corrected as shown below:

Column 6, line 31:

"$i_1$ or $i_2$" should be --$\underline{i}_1$ or $\underline{i}_2$--

Column 6, line 45:

"$1_1$ or $1_2$" should be --$\underline{1}_1$ or $\underline{1}_2$--

Column 6, line 59:

"$1_1$ and $1_2$" should be --$\underline{1}_1$ and $\underline{1}_2$--

Column 7, line 9:

"f" should be --$\underline{f}$--

Column 7, line 15:

"f" should be --$\underline{f}$--

Column 7, line 25:

"f" should be --$\underline{f}$--

Column 7, line 32:

"f" should be --$\underline{f}$--

Column 7, line 39:

"(di/dt)" should be --$\frac{di}{dt}$--

Column 7, line 45:

"f" should be --$\underline{f}$--

UNITED STATES PATENT AND TRADEMARK OFFICE
CERTIFICATE OF CORRECTION

PATENT NO.  : 4,644,457

DATED       : February 17, 1987

INVENTOR(S) : Senichi Masuda

It is certified that error appears in the above-identified patent and that said Letters Patent is hereby corrected as shown below:

Column 11, claim 9, line 43:

"C" should be --$C_L$--

Signed and Sealed this

Twenty-ninth Day of September, 1987

Attest:

DONALD J. QUIGG

Attesting Officer    Commissioner of Patents and Trademarks